United States Patent [19]

Rinaldi

[11] 4,399,412

[45] Aug. 16, 1983

[54] DUTY CYCLE MONITOR CIRCUIT

[75] Inventor: Gerald M. Rinaldi, Mundelein, Ill.

[73] Assignee: GTE Automatic Electric Labs Inc., Northlake, Ill.

[21] Appl. No.: 332,919

[22] Filed: Dec. 21, 1981

[51] Int. Cl.³ ............................................. H03K 5/26
[52] U.S. Cl. .................................... 328/112; 307/234
[58] Field of Search ................ 307/234; 328/111, 112

[56] References Cited

U.S. PATENT DOCUMENTS

| | | | |
|---|---|---|---|
| 3,091,738 | 5/1963 | Relis et al. | 328/111 |
| 3,735,271 | 5/1973 | Leibowitz | 328/112 |
| 3,790,881 | 2/1974 | Smith | 328/112 |
| 3,946,322 | 3/1976 | Katz | 307/234 |
| 3,970,944 | 7/1976 | Huellwegen | 307/234 |

*Primary Examiner*—John S. Heyman
*Attorney, Agent, or Firm*—Gregory G. Hendricks; Robert J. Black

[57] ABSTRACT

A duty cycle monitor circuit which detects variations in the duty cycle of a monitored pulse by comparing its duty cycle with the pulse width of an external reference signal. A detection circuit detects the duty cycle variation of the monitored pulse after being periodically reset by the external reference signal. A storage circuit is clocked by the reference signal and operates to store the output signals of the detection circuit. Upon detection of a duty cycle failure the monitor can be cleared by external control or detection of a monitored pulse having a valid duty cycle.

8 Claims, 1 Drawing Figure

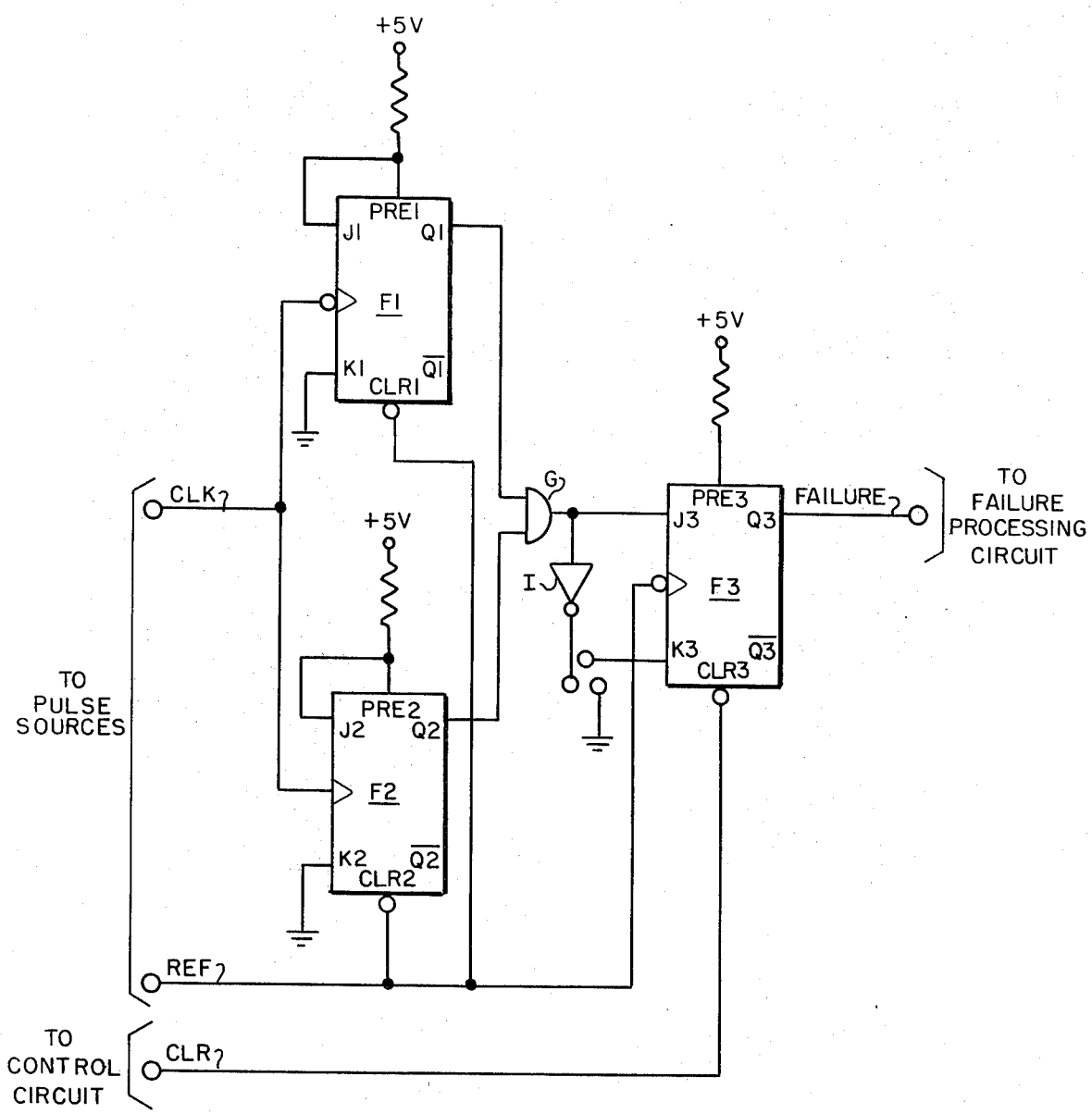

DUTY CYCLE MONITOR CIRCUIT

FIELD OF THE INVENTION

The present invention relates to digital switching systems and more particularly to a duty cycle monitor circuit for use in such switching systems.

DESCRIPTION OF THE PRIOR ART

Typical duty cycle monitor circuits require complex logic circuitry and are sometimes unreliable and subject to race conditions. A recent advancement in the state of the art of pulse monitor circuits was disclosed by H. Ballentine in an article "Clock-Activity Detector Uses One DIP", Electronic Design News, Jan. 5, 1980, page 156. However this circuit is still relatively complex and any detected failure signal is cleared when a monitored clock signal reappears. Some implementations of this circuit also may suffer from potential race problems due to insufficient clear pulse widths.

Accordingly, it is the object of the present invention to provide a minimum component, highly reliable duty cycle monitor circuit, free of any potential race problems and resettable by either an external clear signal or detection of a monitored pulse with a valid duty cycle.

SUMMARY OF THE INVENTION

The present invention is a circuit which detects duty cycle variations of a monitored pulse during time intervals defined by an external reference signal. The external reference signal periodically clears the detection circuit and simultaneously clocks a storage circuit. The detection circuit is clocked by both the positive and negative going edges of a monitored pulse and provides a duty cycle failure signal if both a positive and negative going edges of the monitored pulse are detected during the high time (logic level 1) of a reference signal pulse. Therefore the frequency and duty cycle of the reference signal is chosen such that the high time (logic level 1) of the reference signal pulse is less then the minimum expected pulse width of a monitored pulse. Under these conditions if the detection circuit detects a positive and negative going edge of a monitored pulse the duty cycle of the monitored pulse is decreased to less than the minimum value allowed and therefore the duty cycle has varied to less than the allowed limit.

If a monitored pulse with a valid duty cycle is detected the detection circuit will not generate a duty cycle failure signal and it will be reset by the next reference signal pulse. However if a duty cycle failure is detected this signal is applied to the input of the storage circuit and on the next reference signal pulse the duty cycle variation signal is clocked into the storage circuit and the detection circuit is simultaneously cleared.

In one mode of operation the clock failure condition is latched and the storage circuit thus provides a failure indication even if the duty cycle of the next monitored pulse is valid. Therefore, with this arrangement, a failure condition can only be reset by an external clear signal. In an alternate mode of operation the clock failure condition is not latched. Therefore the external clear signal is not required since the failure condition will be cleared when a monitored pulse reappears with a valid duty cycle.

DESCRIPTION OF THE DRAWING

The single FIGURE of the accompanying drawing is a logic diagram of a duty cycle monitor circuit in accordance with the present invention.

DESCRIPTION OF THE PREFERRED EMBODIMENT

Referring now to the accompanying drawing, the duty cycle monitor circuit of the present invention is shown. The detection circuit includes JK flip-flops F1 and F2, gate G and inverter I. JK flip-flop F1 is a negative edge triggered flip-flop and JK flip-flop F2 is a positive edge triggered flip-flop. These flip-flops have a zero hold time requirement for data appearing at the J and K inputs with respect to the clock. The clock input of both of these flip-flops is connected to the source of monitored pulses. The clear input of these flip-flops and the clock input of negative edge triggered storage flip-flop F3 are connected to the external reference signal source. The J1 and J2 inputs of flip-flops F1 and F2 are connected to plus 5 volts while the K1 and K2 inputs of these flip-flops are connected to ground. The Q1 and Q2 outputs of flip-flops F1 and F2 are connected to the J3 input of flip-flop F3 via AND gate G. The K3 input of flip-flop F3 is connectable to either ground or the output of gate G via inverter I. The clear input of flip-flop F3 is connected to an external clear signal source and the Q3 output of this flip-flop provides a duty cycle failure signal.

This circuit operates to detect duty cycle variations during time intervals defined by the external reference signal. The high time cycle of this external reference signal is chosen to be less than the minimum acceptable pulse width of the monitored pulse. Therefore, a valid monitored pulse should never have a pulse width narrower than the pulse width of the reference signal. If the detection circuit detects both a positive and negative going edge of the monitored pulse during the high time (logic level 1) of the reference signal it is determined to be an invalid pulse and therefore a duty cycle failure.

To initialize this circuit a logic level 0 clear signal is applied to the clear input of flip-flop F3. This causes flip-flop F3 to clear the duty cycle failure signal by applying a logic level 0 signal to the Q3 output. When the reference signal pulse goes to a logic level 0 it causes flip-flops F1 and F2 to reset thereby causing logic level 0 signals to appear at the Q1 and Q2 outputs. Since flip-flops F1 and F2 remain reset for the duration of the low time (logic level 0) of a reference pulse, application of a valid or invalid monitored pulse to the clock inputs of flip-flops F1 and F2 is ignored. Therefore detection of a duty cycle failure can only occur during the high time (logic level 1) of a reference pulse.

If during the high time of a reference pulse a valid monitored pulse is applied to the clock inputs of flip-flops F1 and F2 flip-flop F1 or flip-flop F2, or neither flip-flop F1 nor F2, will be clocked. A maximum of one of these flip-flops can be clocked during the high time of the reference pulse since by definition the pulse width of the reference pulse is chosen to be less than the minimum pulse width of a valid monitored pulse. Therefore a logic level 1 signal may appear at either the Q1 or Q2 output and a logic level 0 signal may appear at the other Q output. Therefore gate G will have a logic level 1 and a logic level 0 signal applied to its inputs and it will cause a logic level 0 signal to be applied to the J3 input of flip-flop F3. On the next negative going edge of a reference pulse flip-flop F3 will be clocked but there will be no change in its output signal since the logic level 0 signal applied to the J3 input will be transferred to the Q3 output. This negative going edge of the reference pulse simultaneously clears flip-flops F1 and F2 and thereby enables them to detect the status of a monitored pulse during the high time of the next reference pulse.

If the pulse width of a monitored pulse has become less than the minimum allowed as determined by the high time of a reference pulse and the phase relationship between the CLK and REF signals, flip-flops F1 and F2 will detect a duty cycle failure. Under these conditions both flip-flops F1 and F2 will be clocked by the corresponding negative and positive going edges of the invalid monitored pulse during the high time of the reference pulse. Therefore logic level 1 signals appear at both the Q1 and Q2 outputs which cause gate G to apply a logic level 1 signal to the J3 input of flip-flop F3. On the next negative going edge of the reference pulse flip-flop F3 will be clocked and thereby transfer the logic level 1 signal appearing on its J3 input to its Q3 output thereby providing a duty cycle failure signal. This negative going edge of the reference pulse simultaneously clears flip-flops F1 and F2 thereby enabling them to detect the status of a subsequent monitored pulse.

If input K3 is connected to inverter I then the inverse of whatever signal appears at the J3 input will appear at the K3 input. Under these conditions the duty cycle failure signal will not remain latched and will be cleared by any subsequent valid monitored pulse. If such a valid pulse should appear at the clock inputs of flip-flops F1 and F2, no more than one of these flip-flops will be clocked during the high time of a reference pulse. This will again result in a logic level 1 and a logic level 0 signal being applied to the inputs of gate G thereby causing a logic level 0 signal to appear at the J3 input and a logic level 1 signal to appear at the K3 input. On the next negative going edge of the reference pulse flip-flop F3 will be clocked and it will transfer these logic level 0 and 1 signals at its J3 and K3 inputs to its Q3 and $\overline{Q3}$ outputs respectively thereby clearing the duty cycle failure signal.

If input K3 is connected to ground, however the duty cycle failure signal will remain latched and can be cleared only by an external logic level 0 clear signal. With this arrangement if a valid monitored pulse should appear at the clock inputs of flip-flops F1 and F2, again logic level 0 and 1 signals will be applied to the inputs of gate G which results in a logic level 0 signal being applied to the J3 input of flip-flop F3. However since the K3 input is connected to ground a logic level 0 signal also appears at this input. Under these conditions flip-flop F3 will remain unchanged when it is clocked by the next negative going edge of the reference pulse and therefore the duty cycle failure signal will remain as a logic level 1 at the Q3 output of flip-flop F3.

Thus the present invention detects duty cycle failure of a monitored pulse by comparing the pulse width of such pulse with the pulse width of an external reference signal. Upon detection of a duty cycle failure this circuit can be cleared either by external control or detection of a valid monitored pulse.

The invention disclosed in this embodiment is unable to detect duty cycle failures during the low time (logic level 0) of a reference pulse. However an obvious modification of the present invention would include an additional pair of positive and negative edge triggered flip-flops which would be cleared by an inverted reference signal. These additional flip-flops would then be capable of detecting duty cycle failures during the low time of a reference pulse. It will be obvious to those skilled in the art that numerous other modifications of the present invention can be made without departing from the spirit of the invention which shall be limited only by the scope of the claims appended hereto.

What is claimed is:

1. A duty cycle monitor circuit for use in a switching system, including a source of reference signal pulses of first and second polarities and a clock signal source normally operated to provide clock signal pulses having a pulse width greater than the pulse width of said reference signal pulses, and abnormally operated to provide clock signal pulses having positive and negative going edges and a pulse width narrower than the pulse width of said reference signal pulses, said duty cycle monitor circuit comprising:

detection means connected to said reference signal source and said clock signal source, operated in response to a reference signal pulse of said first polarity and contemporaneously occurring first and second edges of a clock signal pulse to provide a duty cycle detected signal;

said detection means further operated in response to each reference signal pulse of said second polarity to clear said duty cycle detected signal; and storage means connected to said detection means and to said reference signal source, operated in response to said reference signal pulse of said second polarity and said duty cycle detected signal to provide a duty cycle failure signal.

2. A duty cycle monitor circuit as claimed in claim 1, wherein: said storage means is further operated in response to said reference signal pulse of said second polarity and an absence of said duty cycle detected signal to clear said duty cycle failure signal.

3. A duty cycle monitor circuit as claimed in claim 1, wherein there is further included: a clear signal source; said storage means further connected to said clear signal source, and further operated in response to said clear signal to clear said duty cycle failure signal.

4. A pulse monitor circuit as claimed in claim 1, wherein there is further included; a routing signal source, said pulse monitor circuit further comprising: gating means connected to said clock signal source and said routing signal source, operated in response to said routing signal to inhibit said clock signal from appearing at said detection means.

5. A duty cycle monitor circuit as claimed in claim 1, wherein said detection means comprise: a first flip-flop having a negative edge triggered clock input connected to said clock signal source and a clear input connected to said reference signal source operated to provide a rising edge detected signal;

a second flip-flop having a positive edge triggered clock input connected to said clock signal source and a clear input connected to said reference signal source, operated to provide a falling edge detected signal; and gating means connected to said first and second flip-flops operated in response to said rising edge detected signal and said falling edge detected signal to provide said duty cycle detected signal.

6. A duty cycle monitor circuit as claimed in claim 5, wherein said storage means comprises: a flip-flop having a clock input connected to said reference signal source, a first data input connected to said gating means and a second data input connected to ground.

7. A duty cycle monitor circuit as claimed in claim 2, wherein said detection means comprise: a first flip-flop having a negative edge triggered clock input connected to said clock signal source and a clear input connected to said reference signal source operated to provide a rising edge detected signal;

a second flip-flop having a positive edge triggered clock input connected to said clock signal source and a clear input connected to said reference signal source, operated to provide a falling edge detected signal;

gating means connected to said first and second flip-flops operated in response to said rising edge detected signal and said falling edge detected signal to provide said duty cycle detected signal; and an inverter connected to said gating means, operated to provide an inverted duty cycle detected signal.

8. A pulse monitor circuit as claimed in claim 7, wherein said storage means comprises: a flip-flop having a clock input connected to said reference signal source, a first data input connected to said gating means, and a second data input connected to said inverter.

* * * * *